United States Patent
Paranjpe et al.

(10) Patent No.: US 7,713,881 B2
(45) Date of Patent: May 11, 2010

(54) PROCESS SEQUENCE FOR DOPED SILICON FILL OF DEEP TRENCHES

(75) Inventors: Ajit Paranjpe, Fremont, CA (US); Somnath Nag, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/199,402

(22) Filed: Aug. 27, 2008

(65) Prior Publication Data

US 2008/0318441 A1    Dec. 25, 2008

Related U.S. Application Data

(60) Continuation of application No. 11/420,893, filed on May 30, 2006, now Pat. No. 7,446,366, which is a division of application No. 11/011,550, filed on Dec. 14, 2004, now Pat. No. 7,109,097.

(51) Int. Cl.
    *H01L 21/311* (2006.01)

(52) U.S. Cl. .................. 438/700; 438/243; 438/386; 438/692; 257/E21.17; 257/E21.304; 257/E21.546; 257/E21.586; 257/E21.646; 257/E21.647

(58) Field of Classification Search .............. 438/700, 438/243, 386, 270, 510, 513, 692, 954
    See application file for complete search history.

(56) References Cited

U.S. PATENT DOCUMENTS

| | | | |
|---|---|---|---|
| 4,454,646 A | 6/1984 | Joy et al. | |
| 4,473,598 A | 9/1984 | Ephrath et al. | |
| 4,528,831 A | 7/1985 | Russell et al. | |
| 5,198,387 A | 3/1993 | Tang | |

(Continued)

FOREIGN PATENT DOCUMENTS

KR    1020010041680 A    5/2001

(Continued)

OTHER PUBLICATIONS

International Search Report and Written Opinion of the International Searching Authority dated Sep. 5, 2006 (PCT/US05/44985; APPM/9621PCT).

(Continued)

*Primary Examiner*—David Nhu
(74) *Attorney, Agent, or Firm*—Patterson & Sheridan, LLP

(57) ABSTRACT

A method for void free filling with in-situ doped amorphous silicon of a deep trench structure is provided in which a first fill is carried out in a way so that film deposition occurs from the bottom of the trench upwards, with step coverage well in excess of 100%. In a second fill step, deposition conditions are changed to reduce the impact of dopant on deposition rate, and deposition proceeds at a rate which exceeds the deposition rate of the first fill. In an application of this method to the formation of deep trench capacitor structures, the intermediate steps further including the capping of the void free filled trench with a thick layer of amorphous silicon, planarization of the wafer thereafter, followed by a thermal anneal to redistribute the dopant within the filled trench. Thereafter, additional steps can be performed to complete the formation of the capacitor structure.

16 Claims, 16 Drawing Sheets

U.S. PATENT DOCUMENTS

| | | | |
|---|---|---|---|
| 5,256,566 A | 10/1993 | Bailey | |
| 6,251,722 B1 | 6/2001 | Wei et al. | |
| 6,352,593 B1 | 3/2002 | Brors et al. | |
| 6,436,760 B1 | 8/2002 | Wong et al. | |
| 6,677,218 B2 | 1/2004 | Kirchhoff et al. | |
| 6,815,077 B1 | 11/2004 | Herner et al. | |
| 6,919,255 B2 | 7/2005 | Birner et al. | |
| 7,109,097 B2 * | 9/2006 | Paranjpe et al. | 438/510 |
| 7,265,023 B2 | 9/2007 | Haupt et al. | |
| 7,265,025 B2 | 9/2007 | Temmler et al. | |
| 7,446,366 B2 * | 11/2008 | Paranjpe et al. | 257/303 |
| 2002/0167045 A1 | 11/2002 | Short | |
| 2003/0049372 A1 | 3/2003 | Cook et al. | |
| 2004/0043580 A1 | 3/2004 | Rueger et al. | |

FOREIGN PATENT DOCUMENTS

| | | |
|---|---|---|
| WO | 99-45167 A1 | 9/1999 |

OTHER PUBLICATIONS

Heitzinger, et al.; "Simulation of Arsenic In Situ Doping with Polysilicon CVD and Its Application to High Aspect Ratio Trenches"; IEEE Transactions on Computer-Aided Design of Integrated Circuits and Systems, vol. 22, No. 3, Mar. 2003, pp. 285-292.

First Office Action issued Jul. 4, 2008 in Chinese Application No. 2005800429745 (APPM/009621CHINP).

Notice to File a Response issued Oct. 27, 2008, in Korean Patent Application No. 10-2007-7015164 (APPM/009621 KORS P).

* cited by examiner

Superfill Process
STEP COVERAGE - 105 - 110%

Baseline Fill
STEP COVERAGE - 100%

PROCESS SEQUENCE FOR DOPED SILICON FILL OF DEEP TRENCHES

CROSS-REFERENCE TO RELATED APPLICATIONS

This application is a continuation of U.S. patent application Ser. No. 11/420,893, filed May 30, 2006, now issued as U.S. Pat. No. 7,446,366 (APPM/9621.D1), which is a divisional application of U.S. patent application Ser. No. 11/011,550, filed Dec. 14, 2004, now issued as U.S. Pat. No. 7,109,097 (APPM/9621), which is incorporated by reference herein.

FIELD OF THE INVENTION

Embodiments of the present invention relate generally to a method for filling of deep trenches with low resistivity, doped amorphous silicon films in connection with the fabrication of deep trench capacitors. More particularly the invention deals with a sequential method for the void free filling of said deep trench structures with in-situ doped amorphous silicon. A further feature of the invention is the providing of a production worthy approach for in-situ doped silicon films using a parallel wafer processing reactor.

DESCRIPTION OF THE RELATED ART

Arsenic-doped amorphous silicon films with arsenic concentrations ranging from $10^{20}/cm^3$ to $10^{21}/cm^3$ are used in a variety of semiconductor device applications. These include word lines, bit lines, landing pads, storage node/bit line contact plugs, gate electrodes in ROM devices, as well as floating gate electrode/control gate electrodes in non-volatile memory devices. It is preferred in connection with the fabrication of such structures to use in-situ doping processes for reasons of process simplicity, yield and gap-fill control. Of particular relevance to the instant invention is the use of such doped silicon films in the fabrication of electrodes in deep trench DRAM devices. Important process requirements for these films are: excellent thickness uniformities, dopant concentration and sheet resistance, high dopant activation, low resistivity and good film conformality.

The formation of these trench electrodes is a complex process involving multiple process steps, including the filling of the deep trenches used to form the embedded capacitor structures. With reference to FIG. 3, a filled deep trench structure 50 having an aspect ratio of greater than 25:1 is illustrated (not to scale), in which a processed wafer has been subjected to a number of fabrication steps, including the formation of the deep trench by processes such as etching. A doped well 54 is formed in the crystalline silicon 52 adjacent the trench, the doped well fabricated by conventional techniques (such as by filling with highly doped silicon followed by thermal anneal to diffuse the dopant into the wafer), and the capacitor dielectric 56, a stack of oxide, nitride, and oxide (ONO) layers is formed on the walls to line the trench, using conventional thin film deposition techniques.

Thereafter, the second capacitor electrode is formed from a low resistivity, doped amorphous silicon film by deep trench filling with a doped amorphous silicon 60. Once the trench is filled, a cap layer of undoped silicon (not shown) may be deposited followed by chemical mechanical polishing (CMP) to planarize the wafer surface 58. From there, the wafer is annealed to more evenly distribute and electrically activate dopant throughout the material of the filled trench. In further processing steps, the capacitor is electrically isolated from other structures on the wafer surface, and contact connections established.

Typically, trench filling has been performed in conventional diffusion furnaces, which may be aligned either horizontally or vertically, both of which operate in much the same manner. By way of illustration, a typical vertical LPCVD (Low Pressure Chemical Vapor Deposition) furnace is depicted in FIG. 1. The furnace illustrated includes a chamber consisting of a quartz tube 10 and chamber seal plate 12 into which is inserted a boat 14 for carrying a plurality of substrates 16. In the formation of an in situ doped silicon layer, silane ($SiH_4$) or other similar precursor, a carrier gas such as hydrogen or nitrogen, and a dopant gas such as arsine ($AsH_3$) or phosphine ($PH_3$) enter the gas injection tube 18 from the gas inlet tube 20 through the chamber seal plate 12. The gases exit the process chamber through seal plate 12 and out exhaust port 24. A plurality of heater elements 26 are separately controlled and adjusted to compensate for the well-known depletion of the feed gas concentration as the gas flows from the gas injection tube 18 to the chamber exhaust port 24.

Because of the depletion effects encountered in such diffusion furnaces, it is necessary to operate at very low pressures, generally below 1 Torr, and more usually in the 100 to 200 milli-Torr range. Otherwise, insufficient dopant will be introduced into the filled material, leading to resistivities too high for effective use in these deep trench capacitor structures. However, given the need to operate at such low pressures, film deposition rates are quite slow, e.g. typically 30 to 200 angstroms per minute for deposition of pure silicon, and 5 to 30 angstroms per minute if a dopant gas is introduced. Thus the simultaneous processing of upwards of 50 to 100 wafers at a time is required in order to achieve satisfactory processed wafers per hour throughput.

Operation at higher concentrations of reactant gases in the prior art diffusion furnaces to increase deposition rates results in non-uniform deposition across the substrates and unacceptable differences in the deposition rate from substrate to substrate. Increasing flow rates can improve deposition uniformity at higher pressures. However, increased gas flow increases reactive gas pressure, triggering gas phase nucleation with resultant particle contamination of the substrates. Another drawback associated with the reactor of FIG. 1 includes film deposition on the interior quartz tube 10 and gas injection tube 18. This unwanted deposition decreases the partial pressure of the reactive feed gas concentration near the surface of the substrate 16, resulting in a reduced deposition rate and potential contamination caused when film deposited on the wall of tube 10 and injector tube 18 flakes off and deposits on the substrates 16. Finally, to offset the depletion of reactive chemical species from the entrance to the exit of this style reactor, a temperature gradient is established across the substrate load zone. However, the presence of such gradients creates another problem in the case of polysilicon. Because grain size is temperature dependent, the required temperature gradients will cause poly silicon grain size to vary across the load zone. This variation in grain size from substrate to substrate within a plurality of substrates can cause problems with subsequent patterning of the polysilicon and can result in variations in the electrical performance of the resulting integrated circuits.

In contrast, single wafer CVD processing offers a much broader process window. Such a reactor, illustrated in FIG. 2, includes a rotating substrate carrier 30 onto which a substrate 28 can be placed, enclosed in a vacuum tight chamber having an upper quartz dome 32 and a lower quartz dome 34 and associated chamber wall 36. The substrate 28 is heated by upper lamps 38 and lower lamps 40. Reactant gases are injected through gas input port 42 and exhausted through exhaust port 44.

The single wafer reactor overcomes some of the limitations of the vertical furnace of FIG. 1. It may be operated at higher pressures than vertical LPCVD furnaces (typically at greater than 10 Torr) and does not have an injector tube with its associated problems. The construction details of this type of reactor are covered in such U.S. patents as U.S. Pat. Nos. 5,108,792; 5,576,059; 5,607,724 and 5,614,257. Increased deposition rates result in higher machine productivity and, more importantly, reduce the time the substrates are exposed to high temperatures, i.e. greater than 600° C. At such higher temperatures, exposure over extensive periods of time can cause unwanted changes in semiconductor device structures, the affects becoming more pronounced as device sizes become smaller. A disadvantage of this approach, however, is that such high pressures can also cause gas phase nucleation which can result in particulate contamination of the wafer.

Due to the 'poisoning' effect that severely degrades film uniformity and reduces deposition rates to unacceptably low values, in-situ doping of amorphous silicon films with arsenic (for example, using arsine, $AsH_3$) has not proved to be production worthy in diffusion furnaces. In one approach, a sequential process was attempted in which an undoped amorphous silicon film was exposed to an arsenic source (such as arsine) periodically during deposition. For example, a 200 nm film may be deposited as 50 nm×4 layers, where the film is exposed to arsine following every 50 nm of deposition. In addition to the complexity associated with this process, including process memory effects that are inevitable in a furnace based process involving arsine, a couple of inherent limitations exist which cannot be easily overcome. With such a process, only lightly doped films with dopant concentrations less than $1 \times 10^{20}/cm^3$ can be achieved which translates to unacceptably high film resistivity for next generation deep trench fill applications. Also, the maximum step coverage (ratio of sidewall film thickness to field thickness) achievable approaches but does not exceed 100% for undoped amorphous silicon. In contrast, single wafer CVD processes offer a broader process window, and enable in-situ doping with arsenic. But, there is a tradeoff between deposition rate (i.e., throughput) and step coverage as well as deposition uniformity. With either approach, however, the ability to achieve step coverages exceeding 100% remains to be achieved.

In the case of deep trench capacitors (aspect ratios greater than 10:1), the fabrication process begins with the etching of the deep trench into a silicon wafer. For 90 nm processing, these trenches are typically 6-8 µm deep and 0.15 µm wide, presenting aspect ratios of 40:1 to greater than 50:1. Of particular concern in the case of such deep trench capacitors is the seamless and voidless fill of the trench, the problem becoming more critical as dimensions shrink and aspect ratios become even more aggressive, e.g. as high as 70:1. Especially problematic are formation of voids in the upper portions of the trench, which voids typically form near the top of the trench, downwardly about 10%-30% from the top, the presence of such voids interfering with the later formation of contacts and other isolation structures which form part of the capacitor structure.

In-situ $AsH_3$ doped amorphous silicon film with step coverage exceeding 100% and preferably as high as 150% is necessary for void free filling of these deep trench capacitor structures. Yet, conventional amorphous silicon processes in current use are only able to achieve step coverages of up to a maximum of 100%, which results in voids in the upper portion of the deep trench. Furthermore, high aspect ratio features are often slightly re-entrant, whereby the width of the trench at some point within the trench is slightly larger than the width at a location above it. Void free filling of such structures is impossible unless the step coverage of the deposited film exceeds 100%.

The use of existing diffusion furnaces and/or single wafer processing furnaces thus remains problematic. In the case of the diffusion furnace, where arsine must spread over the wafer by the diffusion mechanism, the $AsH_3$ reacts and is consumed mostly at the outer edges of the wafer, thus greatly affecting uniformity of deposition across the wafer, and making it very difficult to obtain sufficient arsenic in the deposited amorphous silicon layer in the trench. In the case of single wafer furnaces, to be competitive in terms of productivity, they must be run at much higher pressures, such as in the range of 50-200 Torr, in order to obtain the film growth rates required. At these pressures, gas phase nucleation, however, is a problem, which is addressed in part by resorting to relatively high flow rates.

Thus, there remains a need for a production worthy process for void free filling of deep trenches in the fabrication of deep trench capacitors with a low resistivity, high quality doped amorphous silicon.

SUMMARY OF THE INVENTION

The present invention relates generally to a "super-fill" process, and relies on the fact that a different partial pressure and residence time can be achieved for points on the surface of the wafer compared to within the trench by appropriately modulating the gas flow rates and chamber pressure. If the arsine concentration is higher and the gas residence time is shorter at the surface of the trench relative to a point within the trench, the resulting poisoning effect results in a higher deposition rate within the trench relative to the surface. Thus the key is to achieve differential concentrations and gas residence times within the trench relative to the surface.

This novel deep trench super-fill or "V" fill process utilizes the reducing gradient of $AsH_3$ concentration from the top to the bottom of the deep trench achieved under select conditions of deposition of arsenic doped amorphous silicon (α-Si) on a patterned substrate. The process conditions required to achieve a sufficient $AsH_3$ concentration gradient is optimized using three parameters: $AsH_3/SiH_4$ ratio, total gas flow and pressure. This $AsH_3$ gradient causes a reverse gradient of deposition rate from top to bottom of the trench. As a result, the thickness of the film deposited along the sidewall increases from top to bottom of the trench, with the greatest deposition occurring at the bottom, which results in step coverages exceeding 100%.

Due to its high sticking coefficient and the high total pressure of the process, the rate of diffusion of $AsH_3$ into the trench is very low compared to $SiH_4$. The high concentration of $SiH_4$ in the trench and the high total pressure results in a high rate of $SiH_2$ formation inside the trench while the low diffusivity of $AsH_3$ in the trench, reduces the surface poisoning effect. The combined effect results in a high deposition rate at the bottom of the trench while the corresponding concentration of arsine is at its minimum. Thus, there is an increasing gradient of film thickness and a decreasing gradient of in-film arsenic concentration from the top to the bottom of the trench. Since the arsine concentration at the bottom of the trench is still relatively high, the deposited silicon films are in-situ doped with arsenic concentrations exceeding $1 \times 10^{20}/cm^3$.

Due to its high sticking coefficient and the high total pressure of the process, the rate of diffusion of $AsH_3$ into the trench is very low as compared to $SiH_4$. The high concentration of $SiH_4$ in the trench and the high total pressure results in a high rate of $SiH_2$ formation inside the trench while the low diffusivity of $AsH_3$ in the trench, reduces the surface poisoning effect. The combined effect results in a high deposition rate at the bottom of the trench while the corresponding concentration of arsine is at its minimum. Thus, there is an increasing gradient of film thickness and a decreasing gradient of in-film arsenic concentration from the top to the bottom of the trench. Since the arsine concentration at the bottom of the trench is still relatively high, the deposited silicon films are in-situ doped with arsenic concentrations exceeding 1e20/$cm^3$.

Notably, silylene is much more reactive than silane. However, excessive silylene can increase surface roughness of the deposited film, degrade step coverage and possibly initiate gas phase nucleation of particles. In addition, if the silylene driven deposition proceeds too quickly, insufficient arsenic will be incorporated into the trench fill, and acceptable levels of arsenic doping not achieved. In this regard, it has been found useful to include controlled amounts of hydrogen in the arsine/silane flow stream, the presence of hydrogen serving to retard, and thus provide a way to regulate the formation of silylene.

To achieve production worthy throughputs, a parallel wafer processing deposition system, such as one formerly sold by Torrex Equipment Corporation, under the trade name FlexStar™, and now sold by Applied Materials, can be used in the processes of this invention. The unique architecture of the FlexStar™ system allows the reactor to be run in the required regime since the cross-wafer gas flow makes it possible to directly control the residence time (supply) of reactants over the wafer. There is thus no dependence on diffusion to supply reactants to all parts of the wafer surface, as in a typical diffusion furnace. Gas-phase nucleation of particles is also prevented due to this feature. The FlexStar™ deposition system also combines a multi-plenum temperature controlled vertical showerhead injector for uniform cross-wafer gas flow with an isothermal wafer environment that results in excellent wafer temperature uniformity enabling the deposition of undoped and uniformly in-situ doped α-silicon films over a wide process space. Details of the FlexStar parallel wafer processing reactor can be found in issued U.S. Pat. No. 6,352,593 and published patent application US2003/0049372A1, both of which are incorporated herein by reference.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

By way of the present invention it is possible to fill deep trenches with in-situ doped amorphous silicon, and particularly arsenic doped amorphous silicon films, without the formation of voids, while at the same time producing deposited films of high quality, having a step coverage of greater than 100%, and as much as 150%, a WIW (With In Wafer) non uniformity of <±2% to ±5% for 300 mm wafers, and an arsenic concentration of at least $1 \times 10^{20}$/$cm^3$. In addition, in the case of multiple wafer processing, such as is achievable in the FlexStar chamber, hereinafter described, as many as 26-51 wafers can be processed at once.

Figure 1:
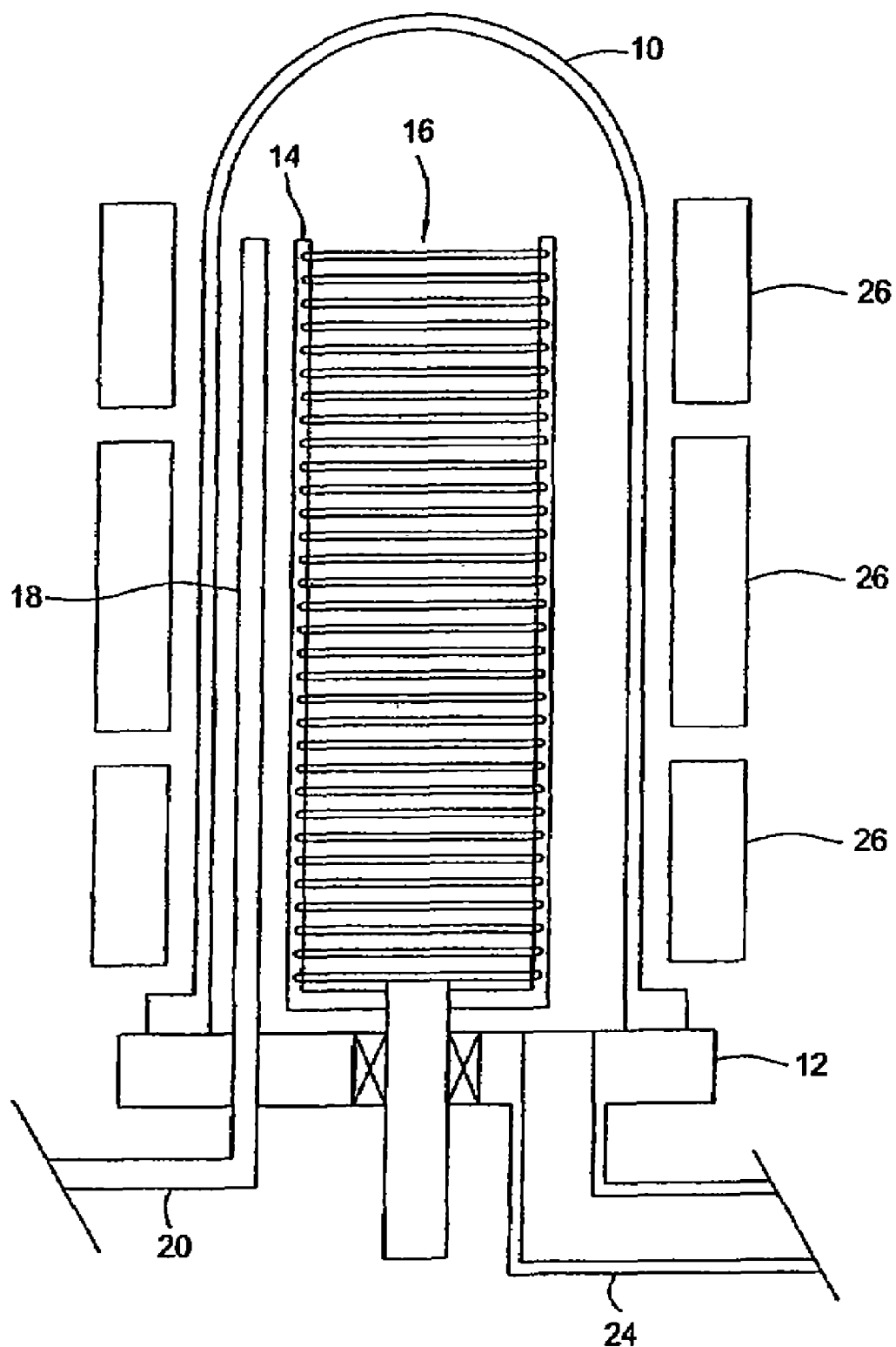
FIG. 1 is a sectional view of a prior art vertical diffusion furnace.
Figure 2:
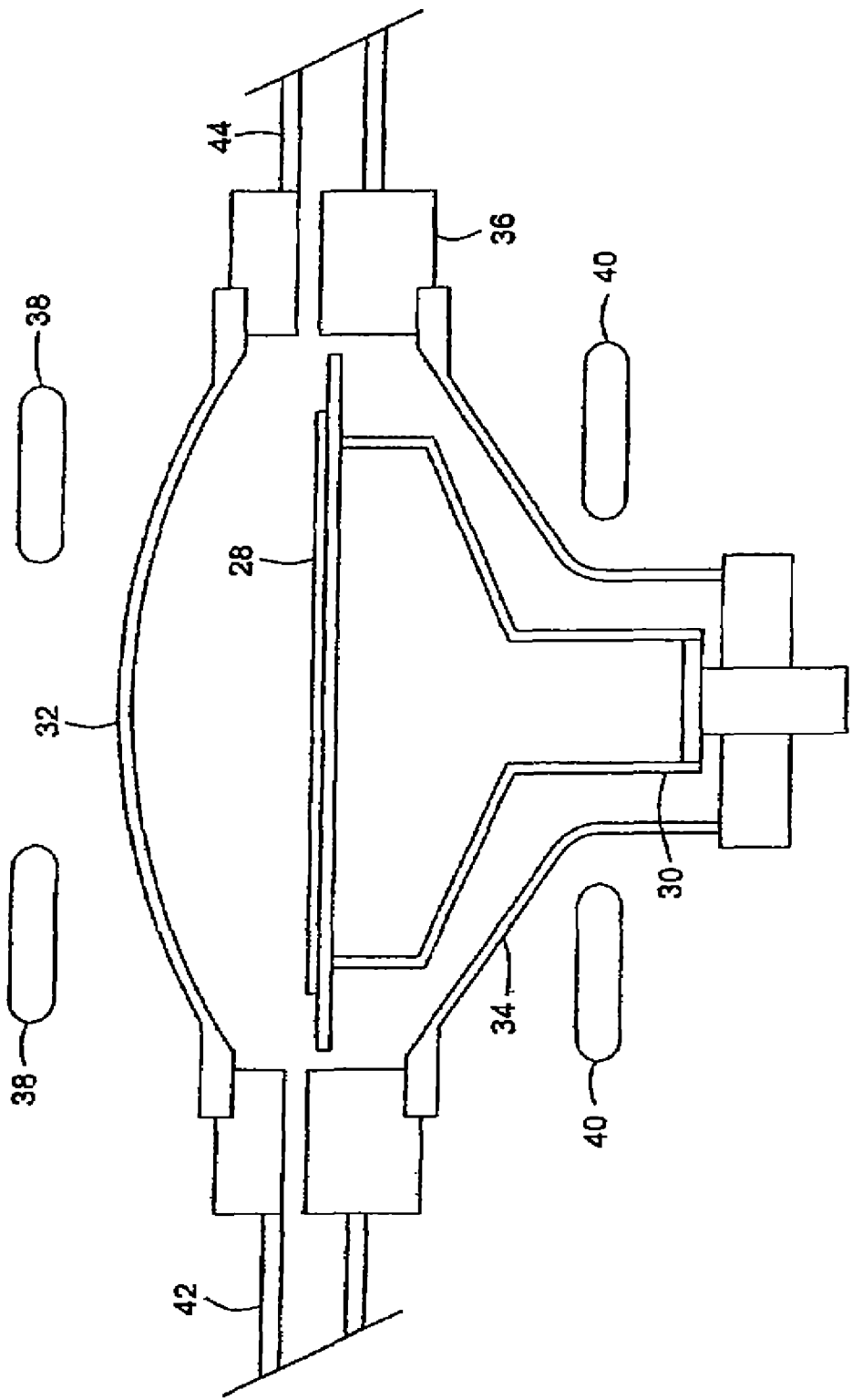
FIG. 2 is a section view of a prior art single wafer processing furnace.
Figure 3:
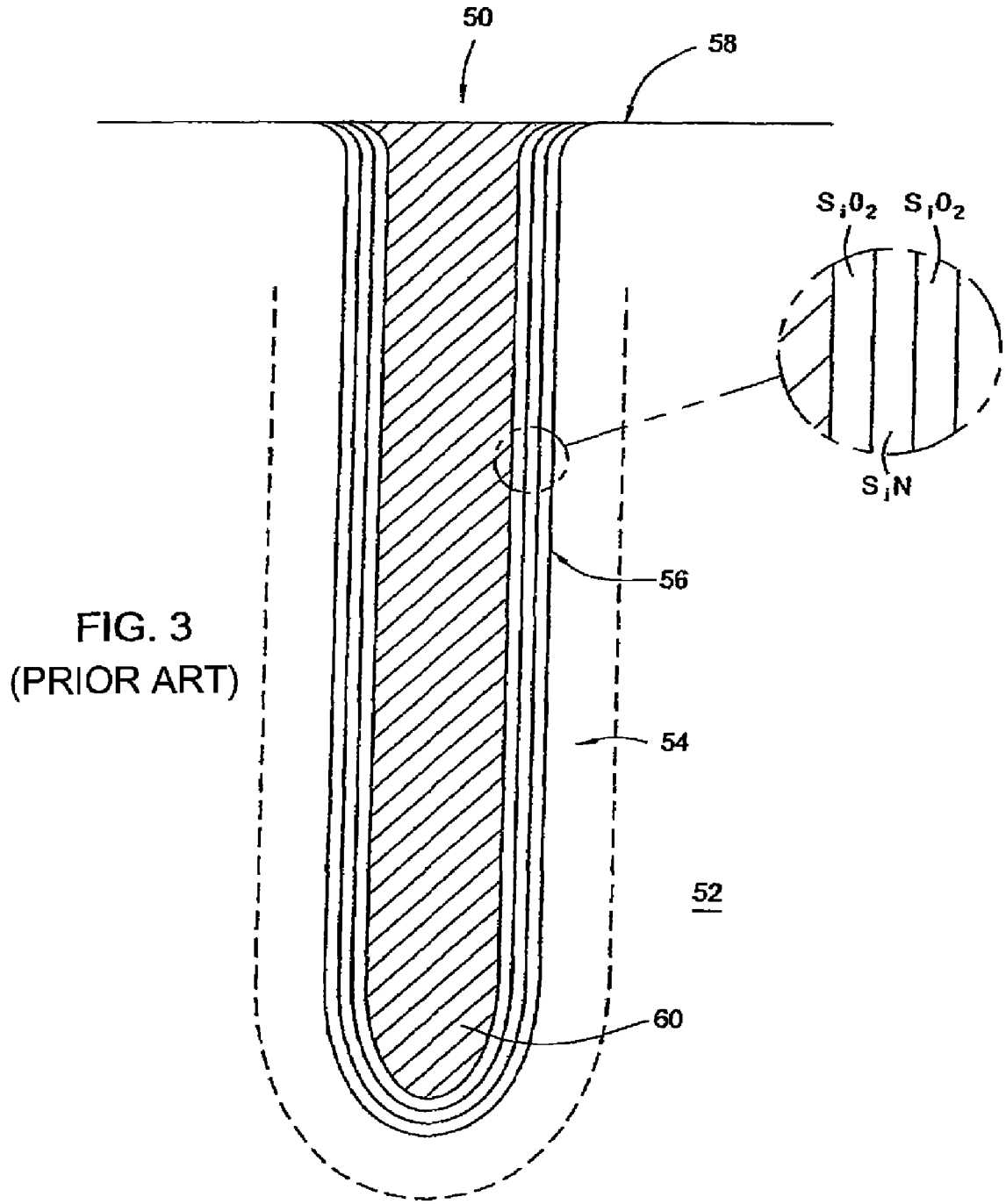
FIG. 3 is a depiction of void free doped silicon filled deep trench capacitor structure at an intermediate stage in capacitor formation, following CMP of the wafer surface.
Figure 4:
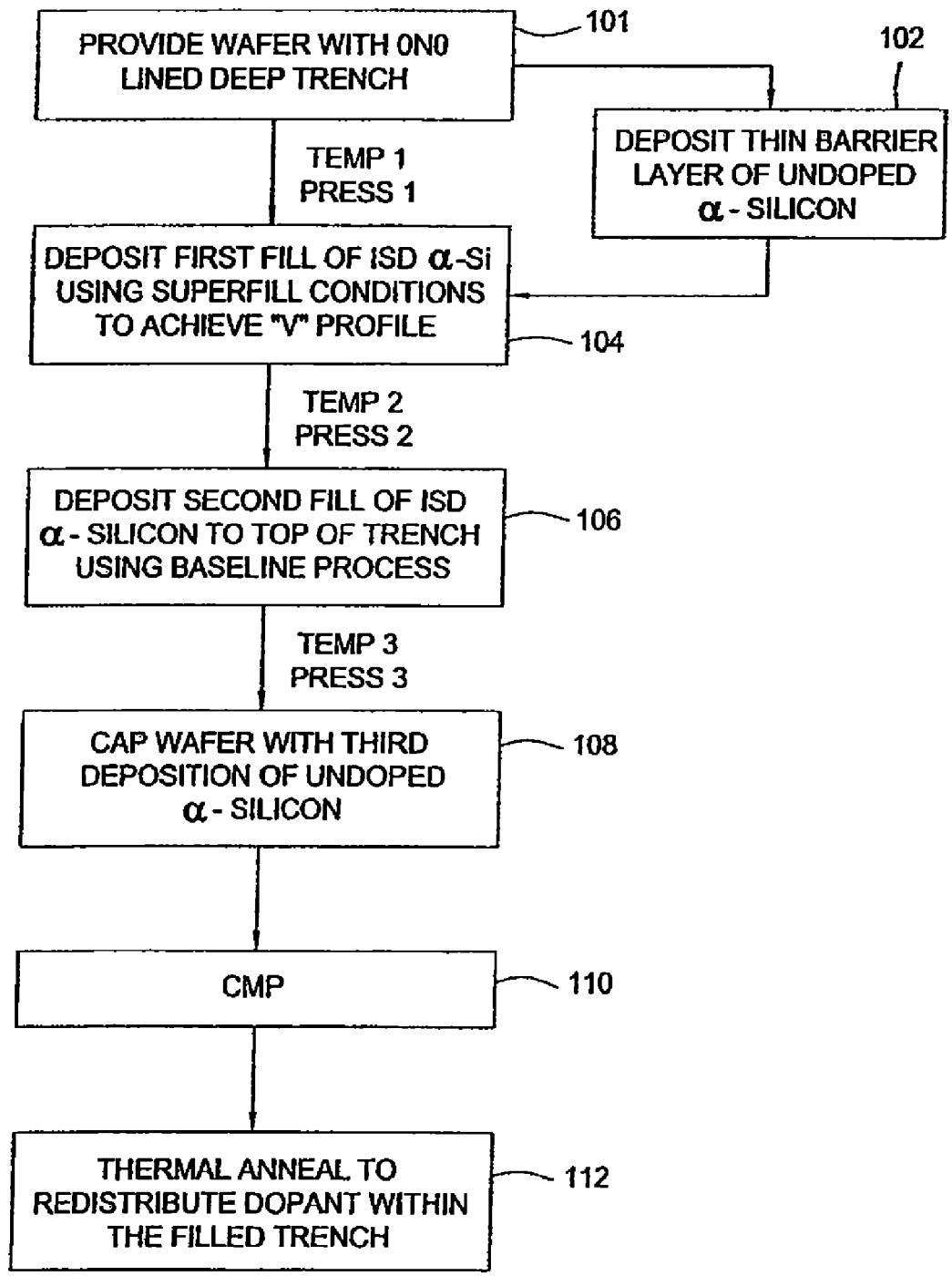
FIG. 4 is a flow chart of the process steps used to obtain the void free fill of the intermediate deep trench capacitor structure of FIG. 3.
Figure 5:
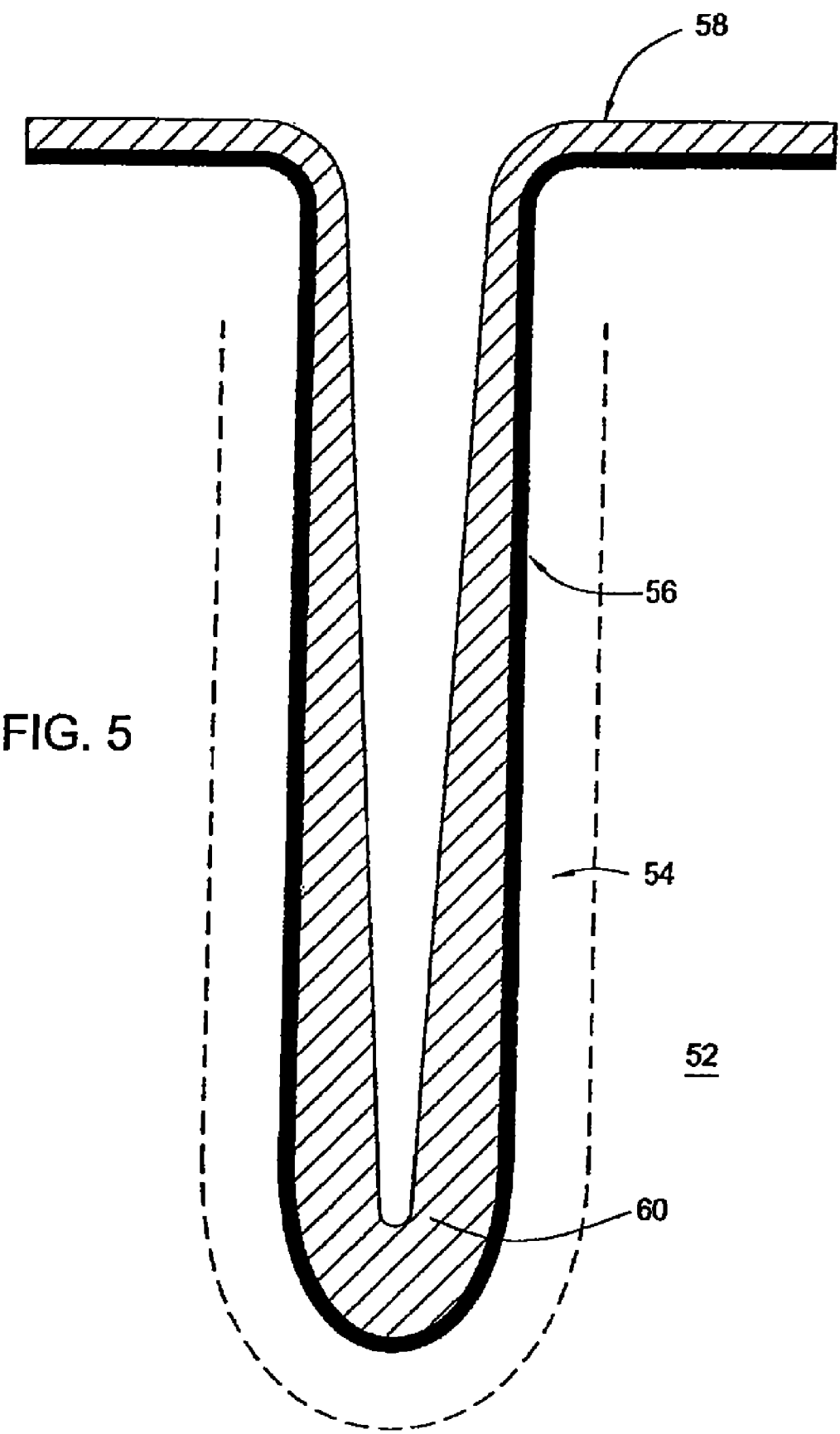
FIG. 5 is a depiction of an unfilled deep trench structure after partial filling with doped amorphous silicon according to the superfill method of this invention.

In the fabrication of deep trench capacitor structures, trenches of high aspect ratio are first formed in single crystal wafers, such trenches having aspect ratios of 25-50:1 or greater, such as may be required for ever smaller critical dimension structures. With reference to FIGS. 4 and 5, in order to provide for a void free trench fill, the filling sequence is carried out in a number of separate steps. To start, a partially processed wafer is provided (Step 101) in which deep trenches have been etched into a single crystal silicon wafer 52, the arsenic doped well 54 surrounding the trench, and the walls of the trench coated with a thin ONO layer 56. Optionally, prior to trench fill, a thin layer of undoped amorphous silicon is deposited into the trench (Step 102), this layer acting as a barrier, to prevent migration of arsenic into the ONO/amorphous silicon interface during later thermal anneal. This barrier layer is deposited to a thickness of between a few to 100 Å. For a typical barrier layer thickness of about 50 Å, and a deposition rate of about 50 Å per minute, the time of deposition will be about 1 minute.

In the first, super-fill step 104 of this invention, in situ doped (ISD) silicon 60 is deposited in the trench, the ratio of $AsH_3$/$SiH_4$ controlled such that a "V" shaped fill profile is obtained. This step is generally carried out in a suitable LPCVD reactor at a temperature T1 which can range from 520° C. to 570° C. and at a pressure P1, which can range from 0.5 to 10 Torr for a given $AsH_3$/$SiH_4$ ratio. The deposition rates in this step generally range between 1 and 10 Å/min. With a typical recipe, as later described, deposition rates of about 3 Å/min can be realized.

With reference to FIG. 5, the results of the first step of the filling sequence are depicted. To affect the filling of the trench with in situ doped amorphous silicon, silane mixed with arsine is introduced into the chamber, with nitrogen and/or hydrogen used as carrier gases. Notably, for a given arsine to silane ratio, the flow of nitrogen can be used to regulate total gas flow rates across the wafer, as well as a means for regulating reaction pressures within the reaction chamber. The presence of hydrogen can be used to suppress the gas phase formation of silylene at the relatively elevated pressures (e.g. 1-4 Torr and above) of the reaction. The temperature of deposition is generally set between 520-570° C. to favor the formation of amorphous silicon.

Figure 6A:
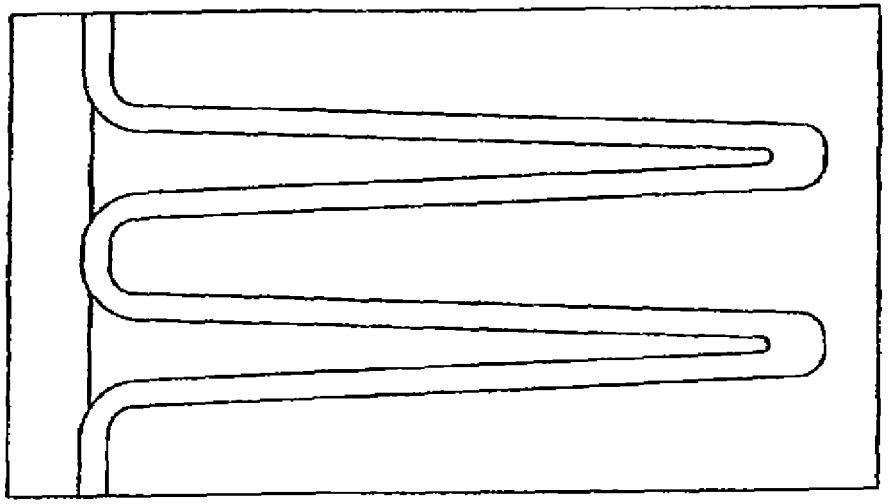
FIG. 6A is a view of a sectioned wafer after super fill of a deep trench as depicted in FIG. 5.

In the formation of this first layer, high arsenic concentrations in the feed gas are used to obtain decreasing deposition rates towards the top of the trench compared to the bottom of the trench to provide step coverage of greater than 100%. To assure the minimum amount of arsenic is incorporated into the deposited amorphous silicon, providing a fill having a sheet resistance of less than 350 Ω/sq after anneal, the deposited arsenic concentration at the bottom of the trench should generally be between $2\times10^{20}/cm^3$ and $1\times10^{21}/cm^3$, with a target concentration of $4\times10^{20}/cm^3$. Inside the trenches the $AsH_3$ concentration is expected to be lower and the $SiH_4$ residence time is expected to be longer relative to the field regions. The resulting fill will generally appear as illustrated in FIG. 6A.

Figure 6B:
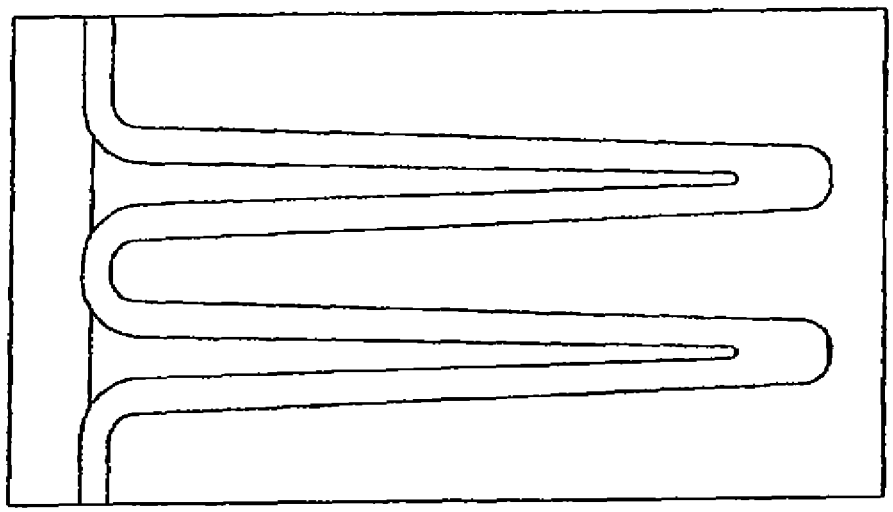
FIG. 6B is a view of a second wafer after first fill using a baseline fill process.
Figure 7:
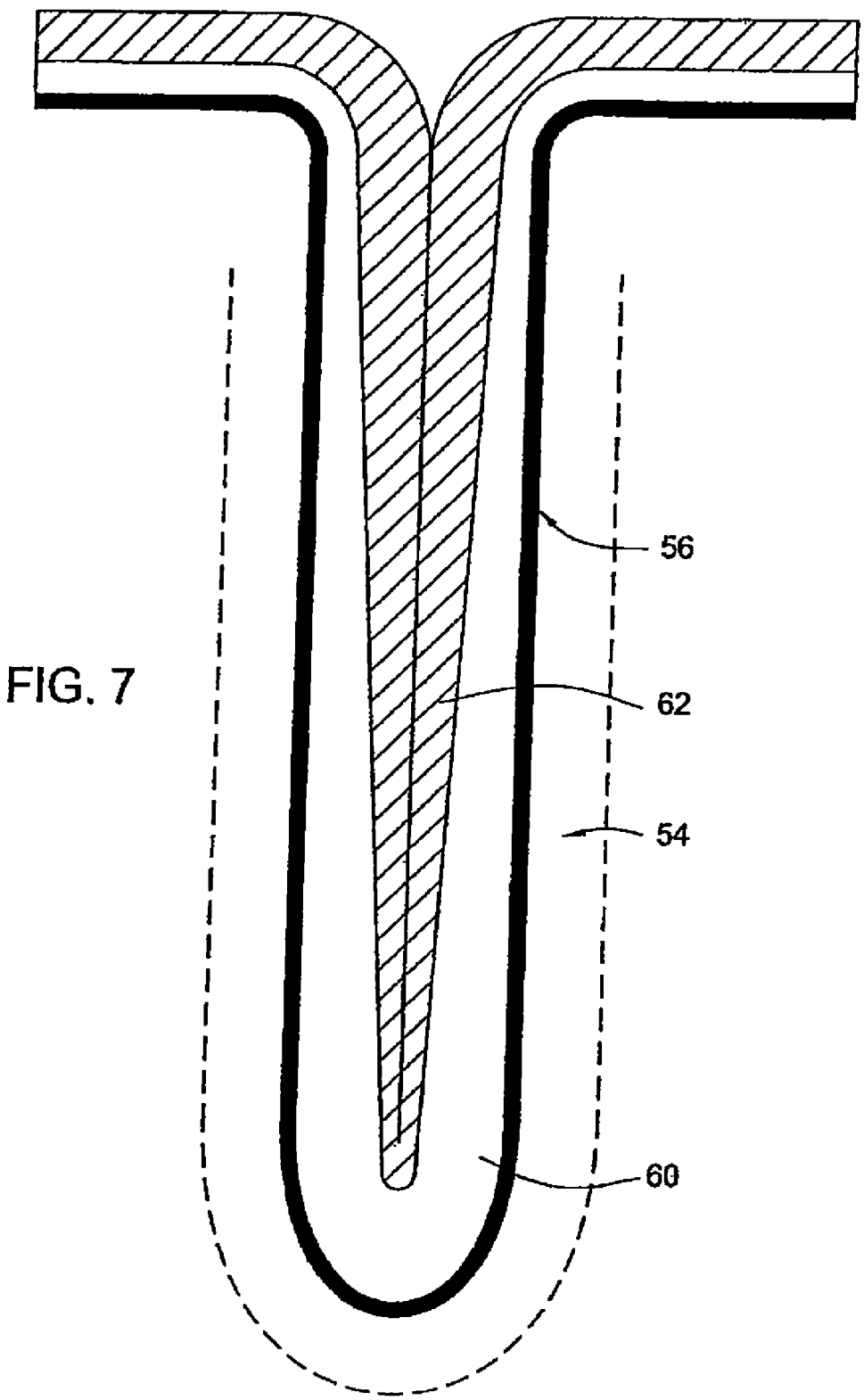
FIG. 7 is a depiction of the structure of FIG. 5 wherein void free trench fill with doped amorphous silicon has been completed using a baseline fill process.

In the next step (106), the remaining fill 62 of the trench is completed. This step constitutes the baseline process, defined as the deposition process conditions which results in a step coverage of the deposited film of about 100%. Target concentrations of arsenic in the deposited fill for this step ranges from $>3\times10^{20}/cm^3$ to $5\times10^{20}/cm^3$. Such baseline process when used to form the first fill results in a deposition profile as shown in FIG. 6B. It is to be understood that if the trench were filled using only the baseline process, a void containing fill would result. However, by first performing the superfill process to create the V shaped fill profile, where the thickness of the deposited in-situ doped film increases with depth, the faster baseline process (e.g. using less arsine) can be employed to complete the void free fill operation to produce the trench fill profile illustrated in FIG. 7.

The baseline fill process itself is run at a temperature T2, which can range from 520° C. to 570° C., and is most conveniently selected to be the same temperature as T1 of step 104. The pressure P2 can range from 0.5 Torr to 10 Torr, but is selected to generally be lower than P1 in order to allow for filling of the trench more quickly. Alternatively, the concentration of Arsine can be reduced to affect even faster filling at the lower pressures. Step 106 is preferably run with the wafer(s) resident in the same process chamber as used in step 104. In this process, with a selected $AsH_3/SiH_4$ ratio of about $3\times10^{-4}$, at a pressure of 2-4 Torr, the resulting film will have a dopant concentration of $\sim5\times10^{20}/cm^{-3}$, with deposition rates generally ranging from 20 to 30 Å/min.

Figure 8:
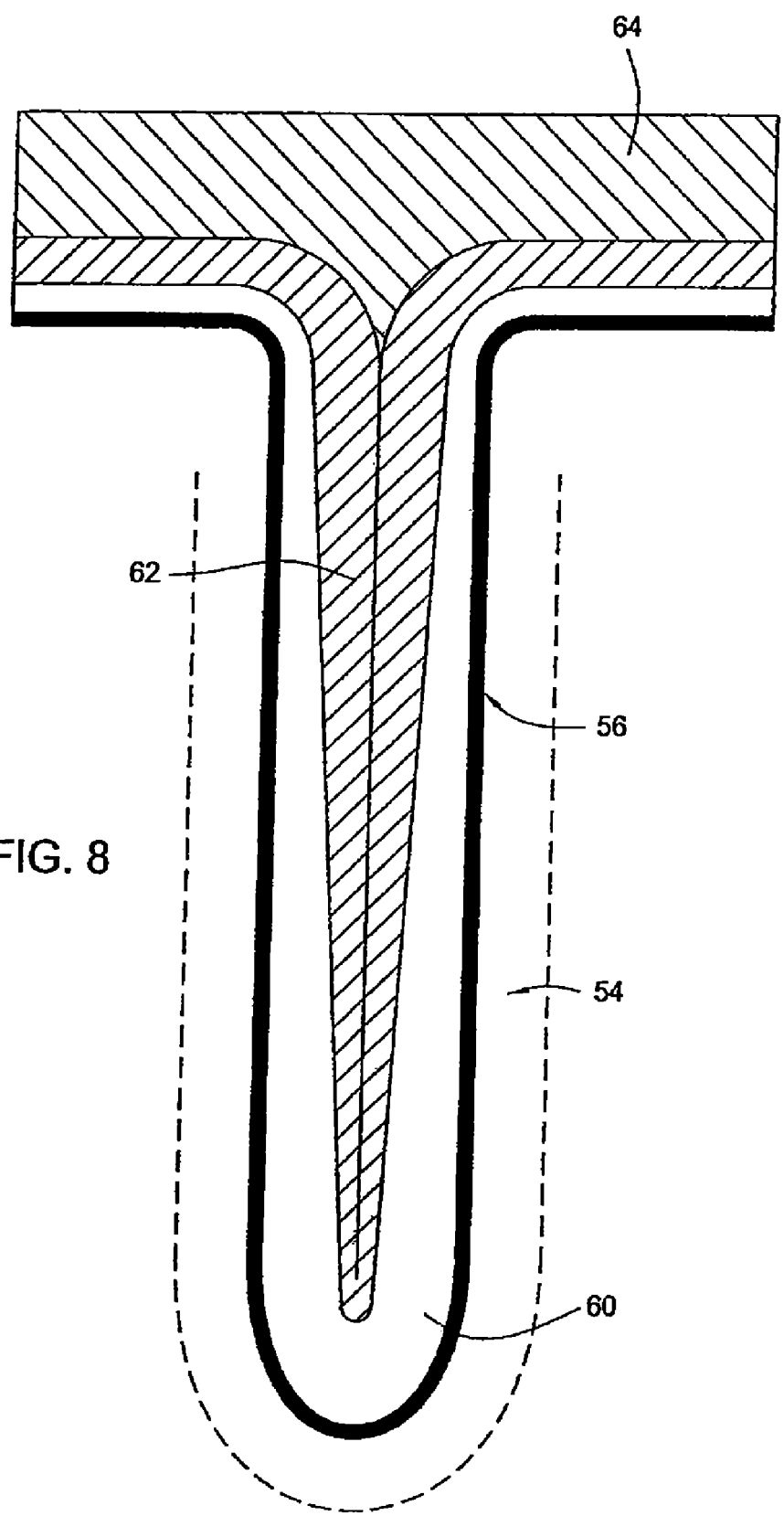
FIG. 8 is a depiction of the deep trench structure of FIG. 7 wherein the capping layer of amorphous silicon has been applied.

In the next step 108, an undoped, blanket capping layer 64 is deposited over the wafer/filled trench as part of the process for planarization of the wafer surface (See FIG. 8). FIG. 8 is a depiction of the deep trench structure of FIG. 7 wherein the capping layer 64 of amorphous silicon has been applied. The thickness of the blanket deposition layer is not critical, but will generally be at least about 1000 Å, and is more commonly in the order of 1000 Å-2500 Å. At the temperatures and pressures of the first two fill steps, the film is deposited at a deposition rate of about 50-60 Å/min. In this blanket deposition step, the pressure of reaction, P3, is generally selected whereby it is less than the pressure of reaction of first step 104 (or even second step 106) since trench fill is no longer an issue, better fill uniformities are obtained at lower pressures, and the risk of gas phase nucleation is reduced. Given the thickness of the to-be-deposited film, this process step will take about 20-40 minutes.

In the next step 108, an undoped, blanket capping layer 64 is deposited over the wafer/filled trench as part of the process for planarization of the wafer surface (See FIG. 8). The thickness of the blanket deposition layer is not critical, but will generally be at least about 1000 Å, and is more commonly in the order of 1000 Å-2500 Å. At the temperatures and pressures of the first two fill steps, the film is deposited at a deposition rate of about 50-60 Å/min. In this blanket deposition step, the pressure of reaction, P3, is generally selected whereby it is less than the pressure of reaction of first step 104 (or even second step 106) since trench fill is no longer an issue, better fill uniformities are obtained at lower pressures, and the risk of gas phase nucleation is reduced. Given the thickness of the to-be-deposited film, this process step will take about 20-40 minutes.

It is to be appreciated that the first two deposition steps, and in fact all three of the silicon deposition steps can be carried out sequentially within the same recipe structure, in the same chamber without having to remove a wafer from the process chamber, or otherwise break vacuum. Thus the three deposition steps, as well as the initial barrier layer deposition, can be conducted relatively rapidly in the same chamber where changes in $AsH_3/SiH_4$ ratios, temperature, total gas flows and pressures can be easily adjusted.

To complete the fill process, the blanketed wafer is subject to a chemical mechanical polishing step (110). Thereafter, the wafer is subject to a thermal anneal (step 112) to better equalize the distribution of the dopant within the deposited amorphous silicon fill material. This anneal process is typically run at about 900° C. for from 30 to 60 minutes in nitrogen, during the process the amorphous silicon converted to randomly oriented small grain polysilicon. During this time, the in situ doped arsenic will be electrically activated and redistribute via diffusion within the silicon fill to flatten the profile of the arsenic concentration with depth.

In developing a recipe for a given patterned wafer of known feature design, including the depth and width (aspect ratios) of the trenches to be filled, a number of process runs can be performed, measurements taken and the relationships between $AsH_3/SiH_4$ ratios, total pressure, flow rates and arsenic concentration established from the empirical data developed.

Several separate depositions can be carried out for various lengths of times. Given the tunable variables, the arsine flow rate, the silane flow rate, the temperature of the reactor, and the overall pressures within the reactor can be adjusted. In the explanation which follows, test runs were conducted in a FlexStar chamber, as later more fully described, with temperatures held at around 540° C. to 550° C. to favor formation of amorphous silicon in the to-be-filled trenches. The flows of arsine and silane were regulated using standard MFCs. Pressure was regulated using nitrogen or nitrogen in combination with hydrogen, or by regulating the throttle valve which controls the chamber exhaust opening. Processes were run at various total pressures ranging from 2, 4 and 8 Torr.

Once the wafers were processed, they were subject to sectioning and SEM analysis. Measurements were taken of field film thicknesses, as well as the thickness of the deposited side wall films at various points along the trench walls. From these measurements, given the time of deposition, both the deposition rate and step coverage at various points within the trenches could be calculated and plotted. Arsenic concentrations in the pre anneal deposited films were measured using micro SIMS (secondary ion mass spectroscopy) analysis, with measurements taken for field films as well as in the trenches. Within wafer uniformity was measured on blanket wafers. The empirically derived data was used to prepare the plots of FIGS. 9A through 9G.

Figure 9A:
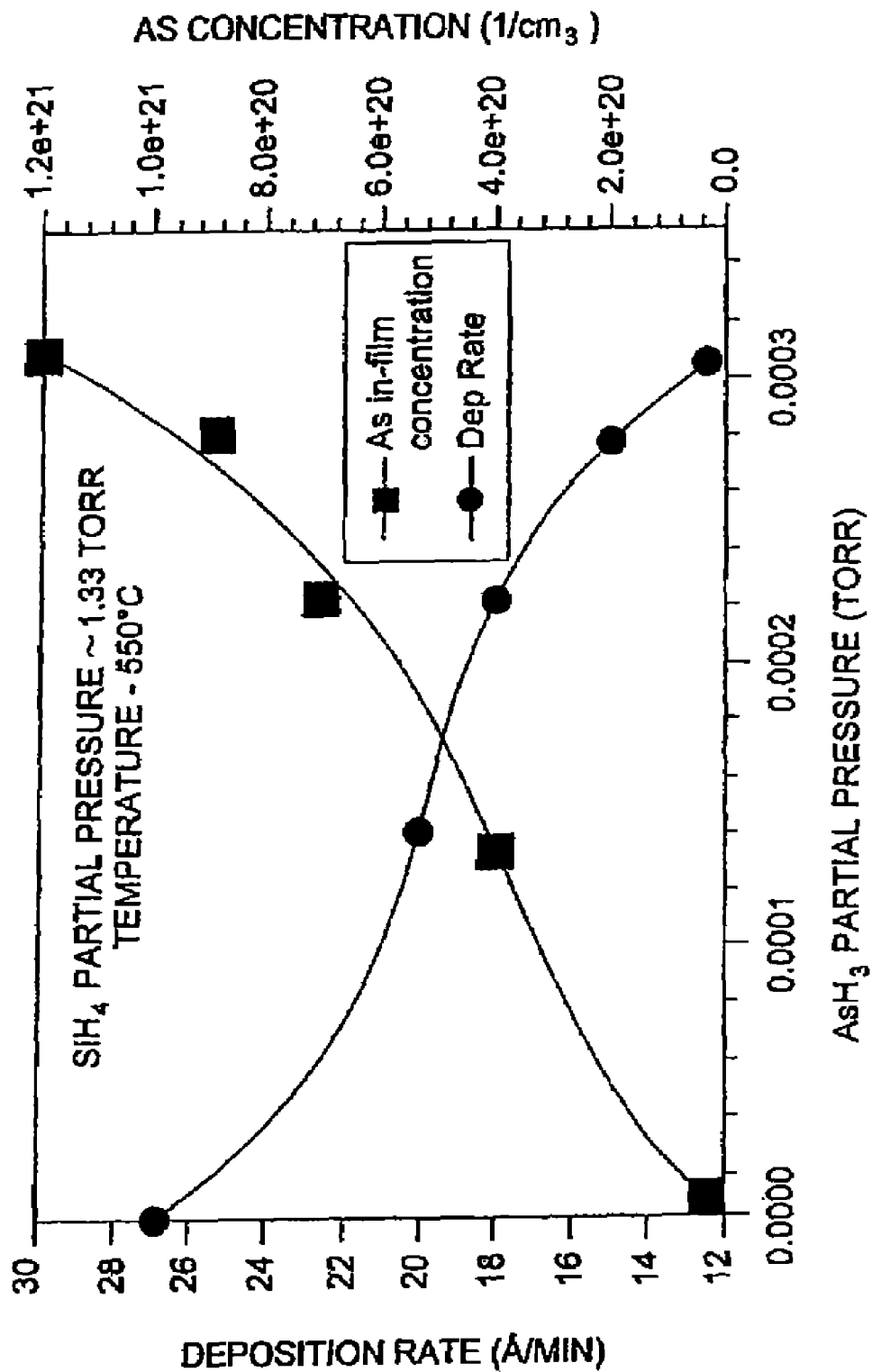
FIGS. 9A-9G are various plots of experimental data derived from wafers processing according to the methods of this invention.
Figure 9B:
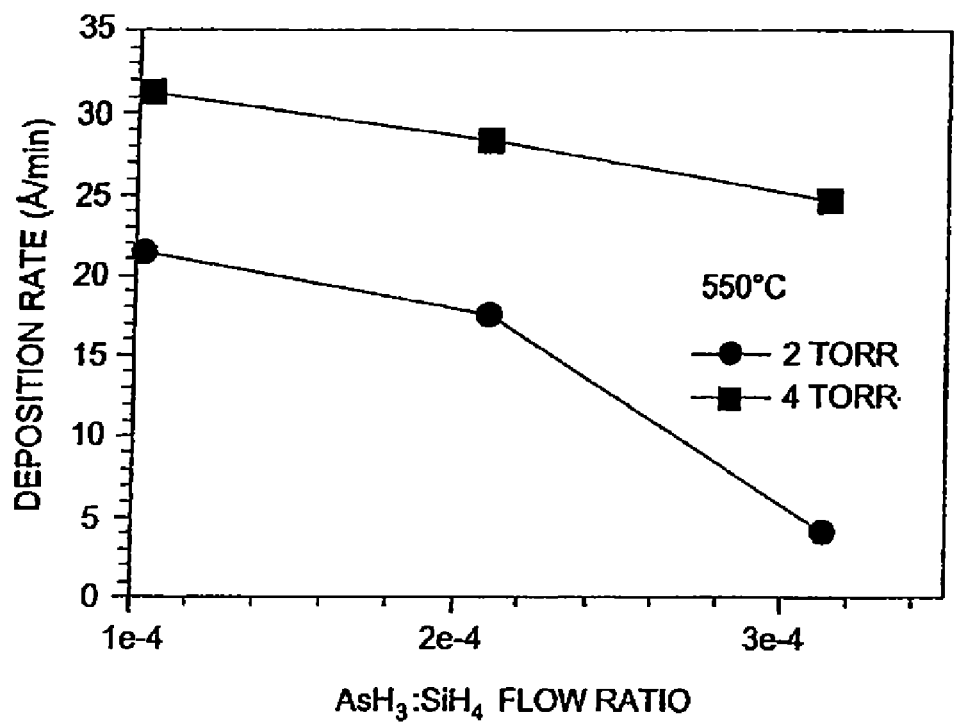
Figure 9C:
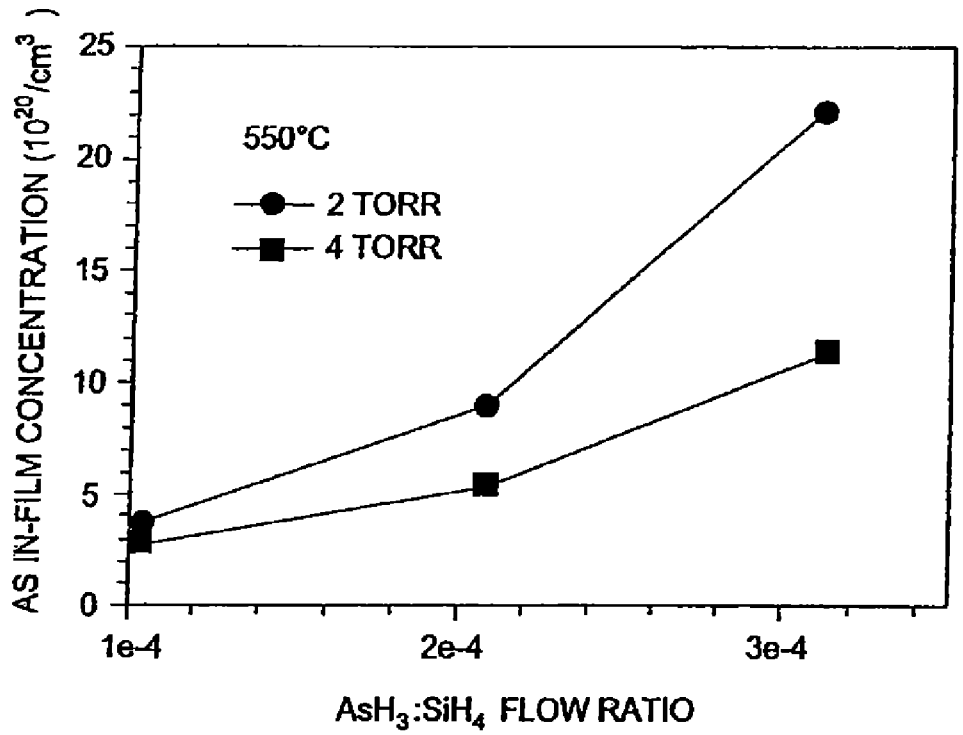
Figure 9D:
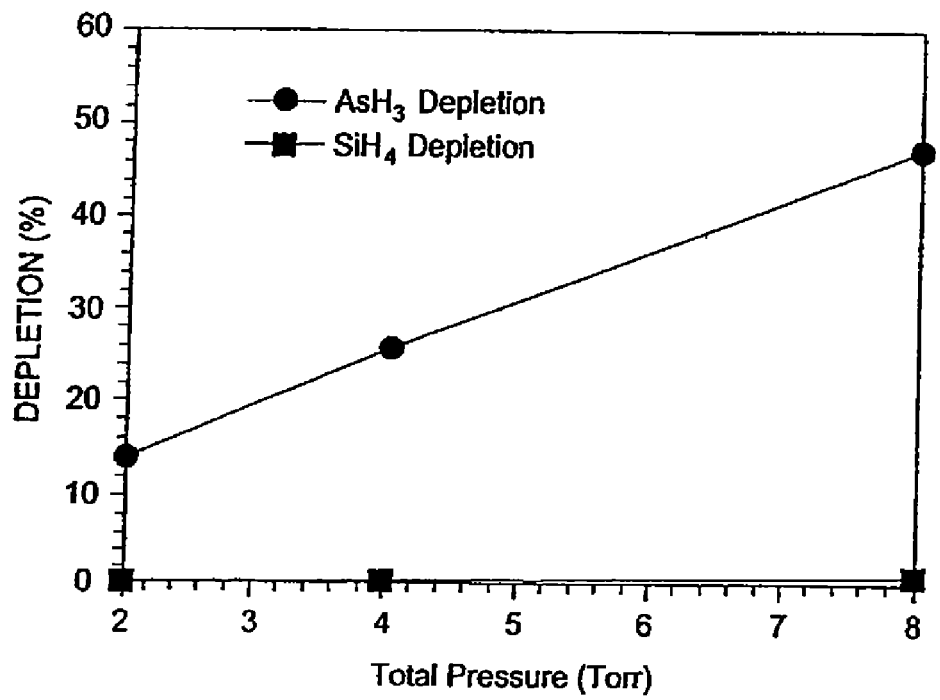
Figure 9E:
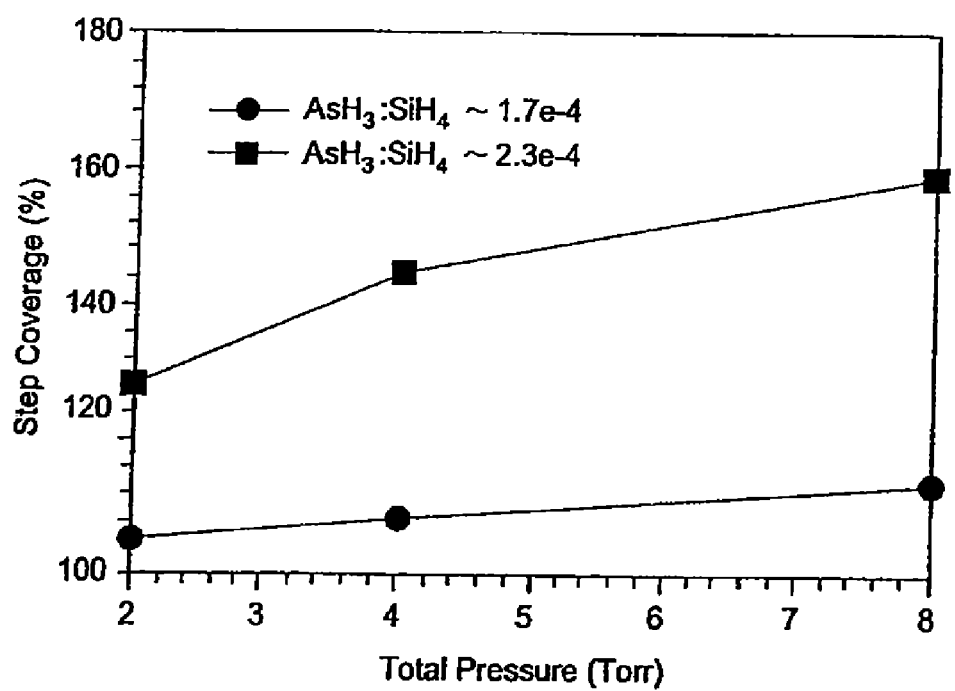
Figure 9F:
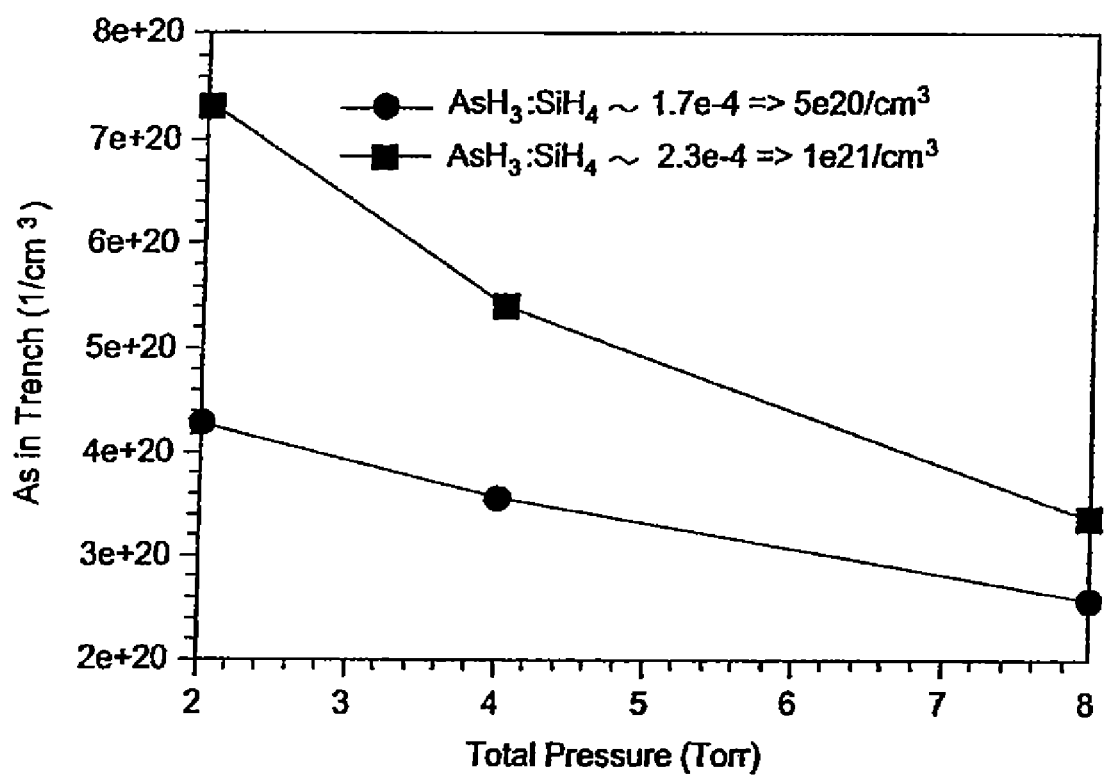

From this data, a modified process was developed in order to achieve superior step coverage. In the discussion that follows the processing of wafers was carried out in a 200/300 mm Flexstar chamber for trenches having an aspect ratio of 40:1. The $AsH_3$ flow is selected so that the ratio of deposition rate for undoped amorphous silicon (i.e., $AsH_3$=0) to the deposition rate for in situ arsenic doped amorphous silicon was at least 1.5×, to target a step coverage of 150%. Deposition rate was used as a metric to estimate the dopant concentration in the film in comparison to undoped amorphous silicon, based on a process database. The plot of deposition rate vs. $AsH_3$ flow shown in FIG. 9B was used to select the $AsH_3$ flow. Additionally, deposition rate, thickness non-uniformity and surface roughness can be used as optimization criteria to finalize the process, which is estimated to have a dopant concentration of ~9×10$^{20}$ cm$^{-3}$ (FIG. 9C).

From this data, a modified process was developed in order to achieve superior step coverage. In the discussion that follows the processing of wafers was carried out in a 200/300 mm Flexstar chamber for trenches having an aspect ratio of 40:1. The $AsH_3$ flow is selected so that the ratio of deposition rate for undoped amorphous silicon (i.e., $AsH_3$=0) to the deposition rate for in situ arsenic doped amorphous silicon was at least 1.5×, to target a step coverage of 150%. Deposition rate was used as a metric to estimate the dopant concentration in the film in comparison to undoped amorphous silicon, based on a process database. The plot of deposition rate vs. $AsH_3$ flow shown in FIG. 9B was used to select the $AsH_3$ flow. Additionally, deposition rate, thickness non-uniformity and surface roughness can be used as optimization criteria to finalize the process, which is estimated to have a dopant concentration of ~9e20 cm$^{-3}$ (FIG. 9C).

In order to achieve bottom up fill, it is desirable to maximize the sensitivity of the deposition rate to the $AsH_3/SiH_4$ ratio such that even a small $AsH_3$ depletion results in a large increase in deposition rate within the trench. This can be achieved in two ways: (a) by increasing the pressure of deposition while maintaining the partial pressure of $SiH_4$ constant and (b) by maintaining a high $AsH_3/SiH_4$ ratio while keeping the $SiH_4$ partial pressure low. $AsH_3$ depletion within the trench increases as the total pressure is increased. The higher pressure retards the diffusion of arsine into the trench which results in its eventual depletion as it is consumed within the deposited film. $AsH_3$ concentration (FIG. 9F) inside the deep trench can also be predicted given the $AsH_3/SiH_4$ ratio and the process pressure. This is achieved by measuring the film thickness deposited at any point along the wall of the deep trench. Expectedly, lower $AsH_3$ concentration within the trench results in films that are thicker but more lightly doped at the bottom of the trench relative to the surface of the trench.

Next a series of depositions were performed at 8 Torr with increasing $AsH_3$ partial pressure (i.e. increasing arsine flows). The results from these tests indicated that a maximum step-coverage of 110-128% was possible with standard total flow of 9.63 slm and an $AsH_3/SiH_4$ ratio of 5×10$^{-4}$. It also demonstrated that the step-coverage improved with increasing total flow (decreases residence time at wafer surface), $AsH_3$ flow (increases arsine poisoning at wafer surface) and depth into the deep trench (depletion is more severe deeper into the trench). A maximum step-coverage of 110% was achieved with this modified process.

Figure 9G:
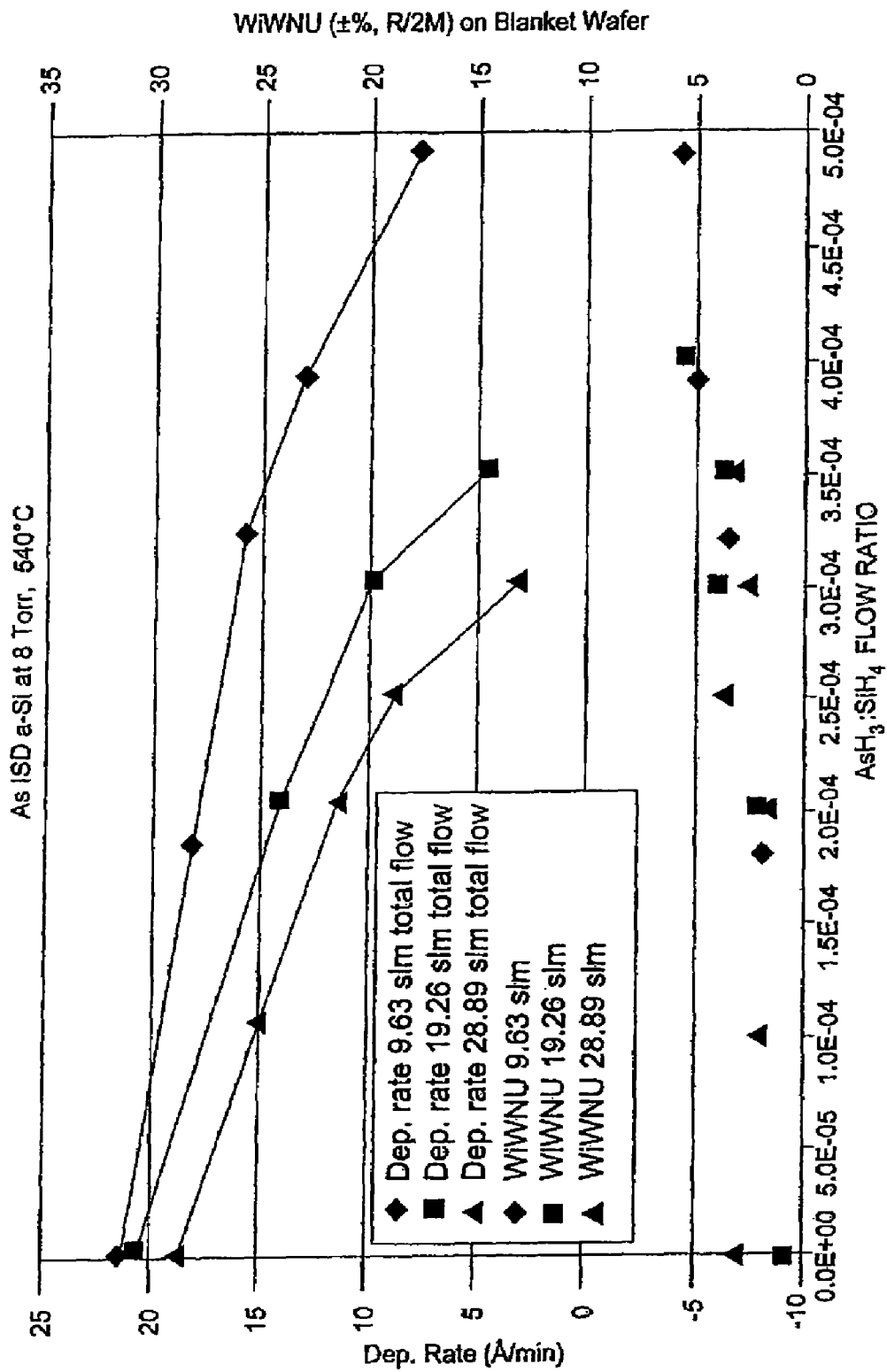

In order to further increase the step-coverage and select the final deep trench V fill processes, three sets of depositions were performed by varying $AsH_3/SiH_4$ ratios at three settings of total flow rate—1×, 2× and 3× of the baseline flow on a blank wafer. This data is shown in FIG. 9G. The deposition rate data from this series was then used to choose three conditions where the deposition rate was <0.25× of the deposition rate for the $AsH_3$=0 case. These conditions were used to deposit the V-shaped superfill films over deep trench wafers in order to measure the step-coverage. The results are shown below.

| $AsH_3/SiH_4$ flow ratio | Total flow | Temp. | Pressure | Film thickness (Blanket Wafer) | Dep. rate (BW) | Thickness (BW) | WiWNU (BW) | Loading effect | Step Coverage at 1.2 μm from trench entrance |
|---|---|---|---|---|---|---|---|---|---|
| [[3.0E−4]] 0.00030 | 28.89 slm | 540° C. | 8 torr | 250 Å | 2.73 Å/min | 250 Å | ±2.07% | ~330% | >115% (trench closed) |
| [[2.5E−4]] 0.00025 | 28.89 slm | 540° C. | 8 torr | 280 Å | 5.60 Å/min | 280 Å | ±4.04% | ~250% | >108% (trench closed) |
| [[4.0E−4]] 0.00040 | 19.26 slm | 540° C. | 8 torr | 250 Å | 2.31 Å/min | 250 Å | ±5.87% | ~280% | 105% (trench open) |

Based on the process development/characterization study described above, a final sequence for the super fill process was chosen as follows:

Step-1: A thin layer was deposited using the V fill process (8 Torr, 28.89 slm total flow, $AsH_3/SiH4$=0.00040 and $T_{dep}$=540° C.). This forms the initial V-shaped profile required inside the deep trench prior to completing the fill with the baseline arsenic doped amorphous silicon process. The thickness of this layer was chosen so that a V shaped profile was obtained within the trench.

Step-2: The trench was filled with the baseline in-situ $AsH_3$ doped amorphous silicon process (4 Torr, 9.63 slm total flow, $AsH_3/SiH_4$=0.00020 and $T_{dep}$=540° C.).

Step-3: A thick undoped amorphous silicon cap layer was deposited to planarize the surface.

A typical recipe is illustrated below for the deposition of a void free fill of arsenic doped amorphous silicon.

|  | Undoped α-silicon barrier | First fill deposition | Baseline Fast Fill deposition | Undoped Cap |
| --- | --- | --- | --- | --- |
| Layer thickness | 50-100 Å | 100-300 Å | 400A-800 Å | 1800 Å |
| N2 | 0.3 slm | 22 slm | 0 slm | 0.3 slm |
| H2 | 2.1 slm | 2.3 slm | 2.3 slm | 2.1 slm |
| AsH3 | 0 sccm | 0.2 sccm | 0.1 sccm | 0 |
| Silane | 4.8 slm | 4.8 slm | 4.8 slm | 4.8 slm |
| Pressure | 2 Torr | 8 Torr | 4 Torr | 2 Torr |
| Temperature | 540 C. | 540 C. | 540 C. | 540 C. |
| Time (approx) | 1-2 min | up to 100 min | 8-16 min | 36 min |

As noted before, the process sequence of this invention can be carried out in a single wafer LPCVD chamber. However such single wafer processing, even if carried out on a cluster tool platform where up to 4-5 single wafer process chambers are directly connected to a central transfer chamber, does not yield a commercially viable process, given the relatively long deposition times required. However, the FlexStar™ deposition system, with its vertical stack of virtual single wafer processing chambers is particularly suited for the processes of this invention. This system, which can process 200 mm and 300 mm wafers, combines a multi-plenum temperature controlled vertical showerhead injector (for uniform cross-wafer gas flow) with an isothermal wafer environment that results in excellent wafer temperature uniformity enabling the deposition of undoped and uniformly in-situ doped amorphous silicon films over a wide process space. The unique architecture of the FlexStar™ system allows the reactor to be run in this process regime since the cross-wafer gas flow makes it possible to directly control the residence time (supply) of reactants over each of the wafers. There is thus no dependence on diffusion to supply reactants to all parts of the wafer surface, as in a typical diffusion furnace. Gas-phase nucleation of particles is also prevented due to this feature.

Total process time for void free trench fill of this invention is about 154 minutes. In the case of single wafer processing this would simply be unacceptable in a manufacturing environment. With the FlexStar parallel wafer processing reactor which processes up to 26 wafers at a time, throughputs of 6 WPH are afforded. By employing a modified parallel processing chamber designed to accommodate a 51 wafer boat, productivity can be doubled. Further productivity gains can be realized using the apparatus illustrated in FIG. 12, in which two Torrex chambers 200 (which may be combined with other process chambers 202A, 202B), are affixed to a multisided transfer chamber 112.

Figure 10:
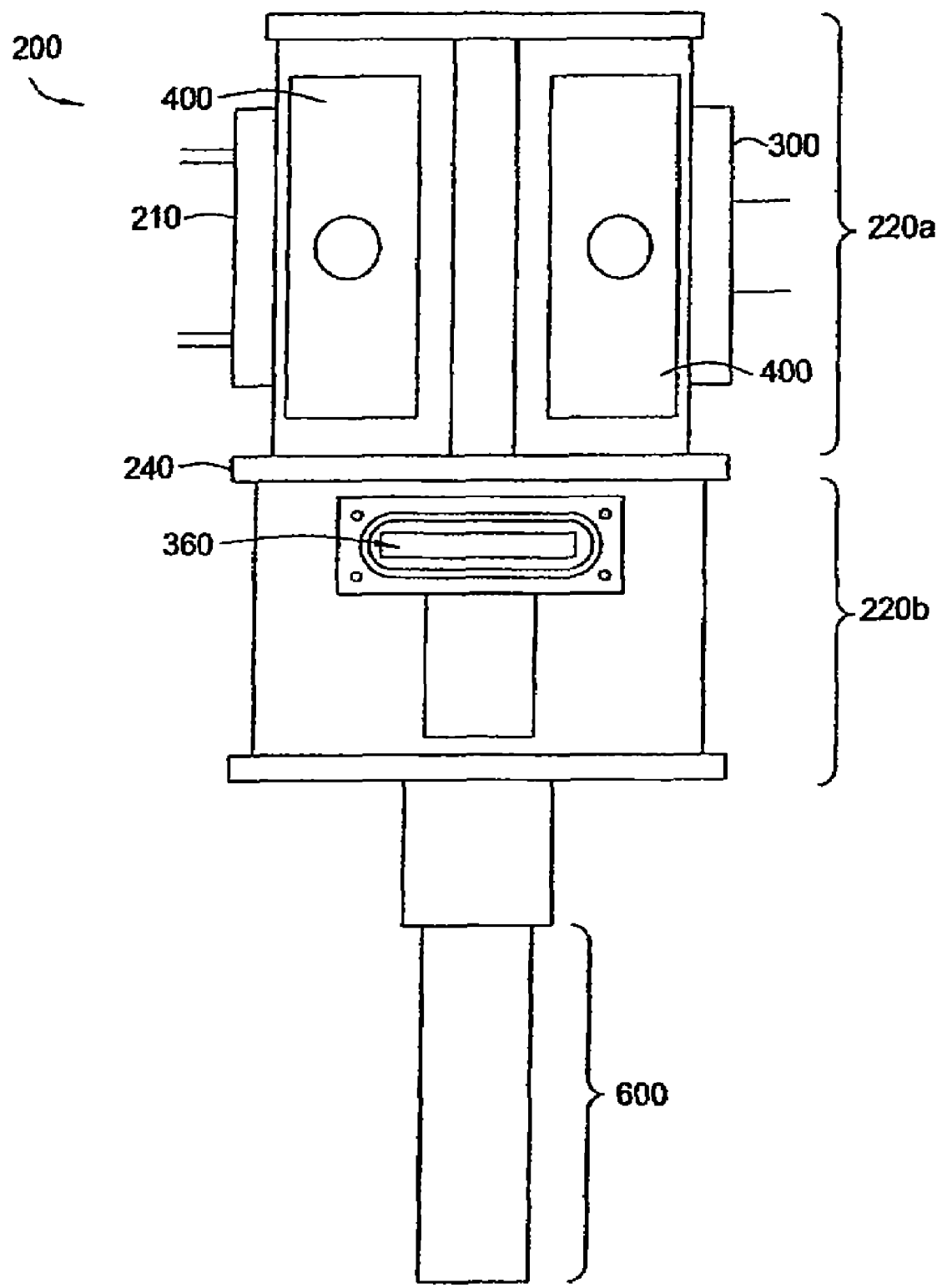
FIGS. 10 and 11 depict a FlexStar™ parallel wafer processing reactor for use in the commercial production of void free deep trench capacitor structures according to the methods of this invention.
Figure 11:
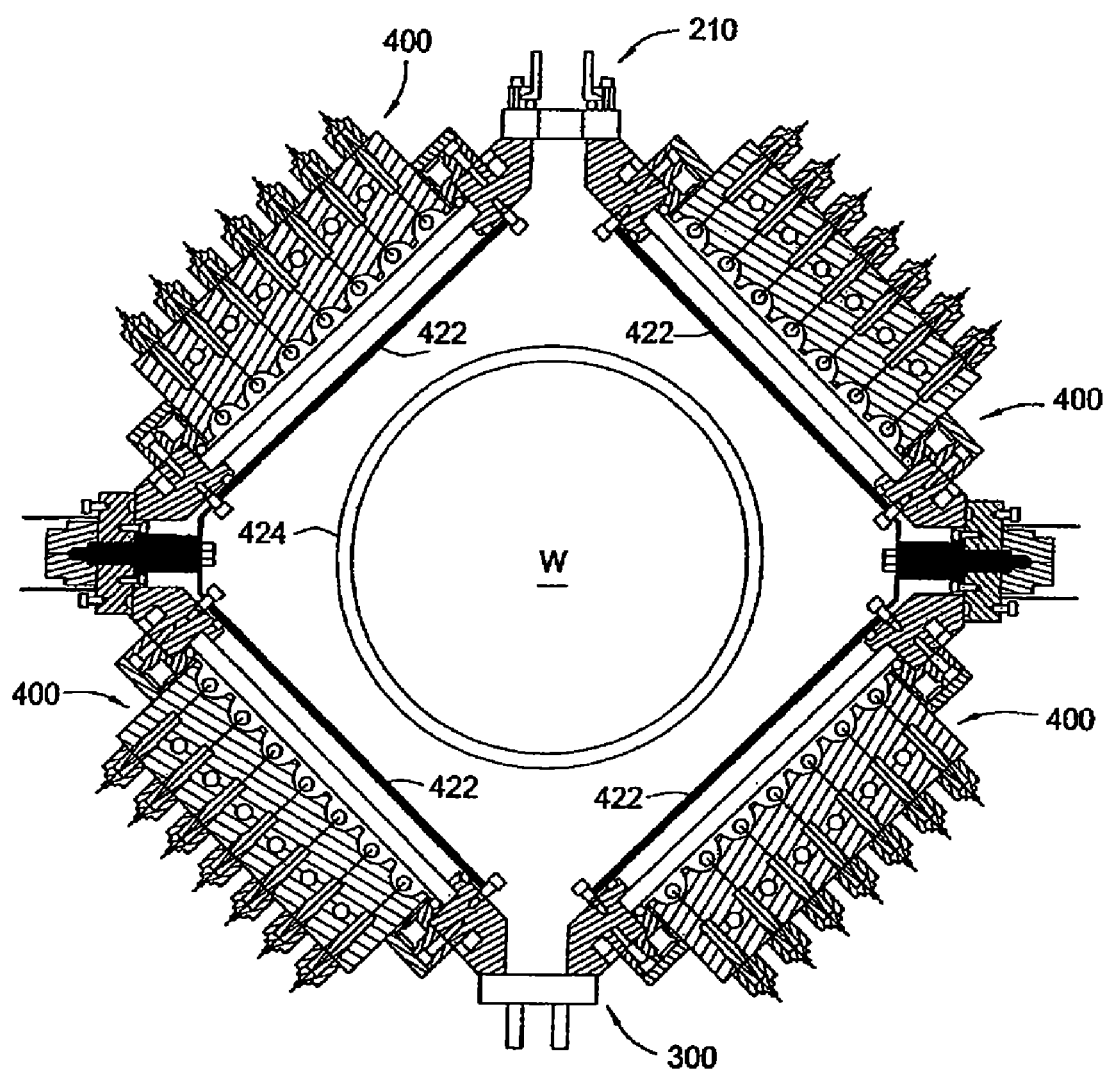

The FlexStar™ chamber 200 (FIG. 10-11) includes a vertical temperature controlled showerhead 210 for gas injection, a vertical temperature controlled exhaust 300, and four PID/pyrometer controlled multi-zone linear lamp arrays 400 with thermal radiant diffusion shields 422 for heating a susceptor boat (not shown) for holding the to-be-processed wafers. The rotating boat, configured for 26 wafers (configurable to hold up to 51 wafers), consists of high-mass SiC coated graphite susceptors 424 with wafers robotically loaded through port 360 onto wafer support pins between pairs of susceptors. This geometry establishes a virtual black body cavity in between pairs of susceptors. Thermal symmetry along the length of the boat and across each susceptor makes the process results independent of wafer load, and wafer temperature insensitive to small thermal excursions.

Two separate sets of support pins are included on each susceptor such that both 200 mm and 300 mm wafers can be loaded in the same run without the need for any hardware change. The boat is heated to a set temperature by re-radiation from the thermal diffusion shields. The cross-wafer gas flow established from the vertical showerhead 210 through the boat and into the vertical exhaust 300 eliminates gas stagnation, minimizes gas phase depletion and provides precise control over the residence time which serves to suppress gas phase particle generation. The shield geometry obstructs gas flow around the boat forcing cross-wafer gas flow through the boat. Since the diameter of the susceptors exceeds the diameter of the wafers, the process gases are pre-heated and the boundary layer is fully established before the flow reaches the wafer, minimizing wafer edge effects. Flow conductance is controlled by the inter-susceptor spacing, unlike a vertical diffusion furnace where the flow conductance is influenced by wafers loaded in the boat. Hence, partial lots centered axially within the susceptor boat can be processed, obviating the need for dummy wafers in the remainder of the load zone. The isothermal environment coupled with cross-wafer gas flow results in ultra-uniform deposited films over a wide pressure range (0.5-10 Torr).

Figure 12:
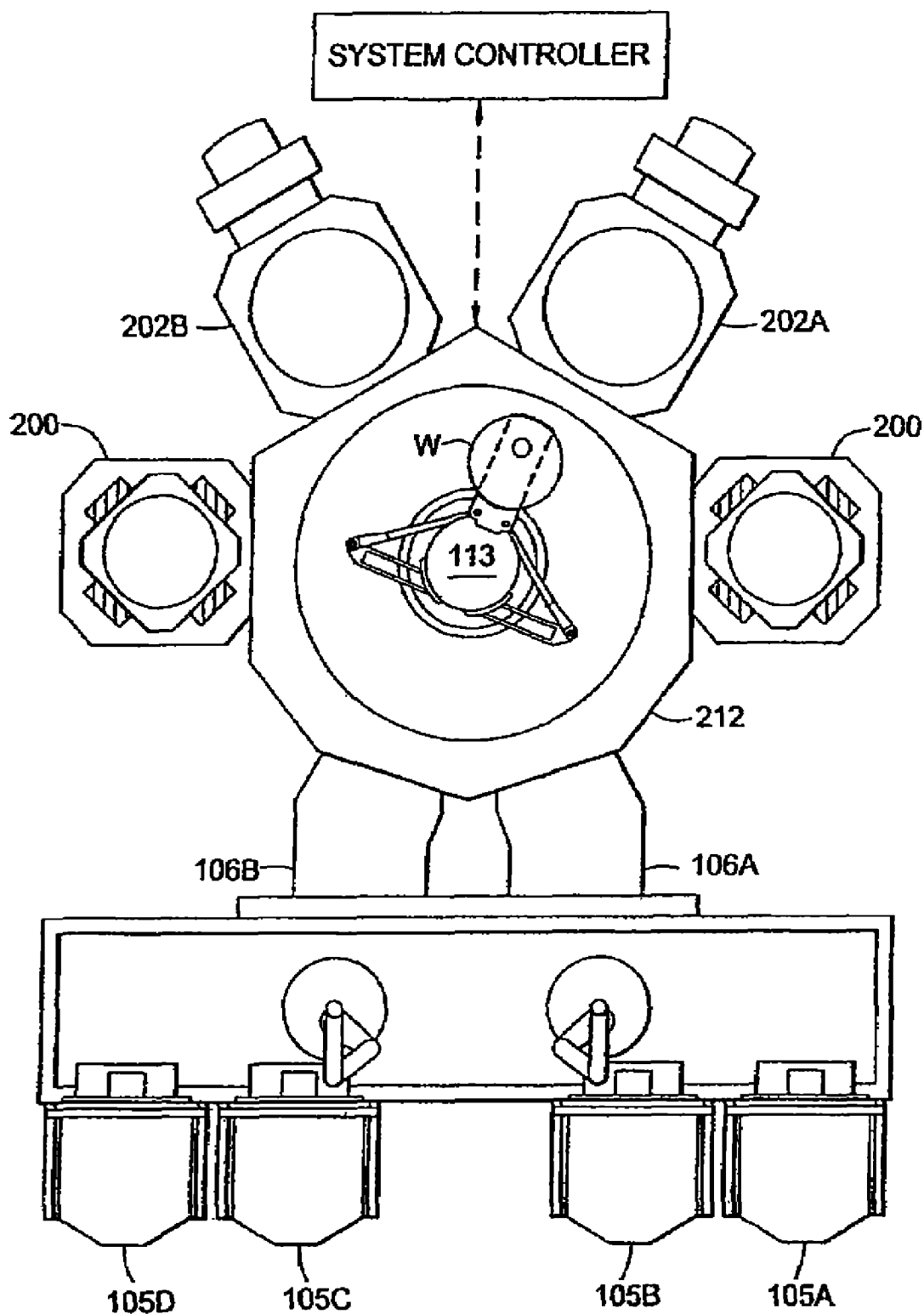
FIG. 12 is an illustration of a cluster tool, based on the Centura® platform sold by Applied Materials of Santa Clara, Calif. including two FlexStar™ reactors.

Wafers are loaded into the wafer boat between pairs of hot susceptors while it is positioned within loading zone 220b, the boat incremented vertically by lifting and rotating mechanism 600 until all wafers have been loaded. Thereafter, the filled boat is raised into processing zone 220a of chamber 200, where the wafers are rotated during processing. With further reference to FIG. 12, after processing is completed, wafers are unloaded from the boat through opening 360 by a robotic arm 113 and placed into one of two actively cooled load lock chambers 106A and 106B. Once the wafers have sufficiently cooled, the processed wafers are removed from the load locks and returned to the FOUPs or cassettes 105A-105D in the atmospheric load ports.

In summary, the V fill process of this invention relies on the fact that a different partial pressure and residence time can be achieved for points on the surface of the wafer compared to within the trench by modulating the gas flow rates and chamber pressure appropriately. So long as arsine concentration is higher and the gas residence time is shorter at the surface of the trench relative to a point within the trench, the poisoning effect results in higher deposition rates within the trench relative to the surface. Thus the key is to achieve differential concentrations and gas residence times within the trench relative to the surface.

Since both gas residence time and partial pressure have to be carefully controlled, the process is best operated at high total flows and pressure. High total flows result in a short residence time of gases on the wafer surface. This convective flow across the wafer ensures an adequate and continuous supply of both arsine and silane to the wafer surface so that the gradient of reactant concentrations across the wafer surface is very small which is essential for good film uniformity across the wafer. In contrast, the gas residence time within the trench is longer since reactant transport within the trench occurs via the relatively slow process of diffusion rather than the much faster convective transport that is operative at the wafer surface.

In an alternative embodiment of the present invention, instead of using $AsH_3$, the diffusion of the arsenic source gas into the trench can be further slowed down by using a higher molecular weight arsenic source such as t-butyl arsine. Other suitable gaseous sources include trimethyl arsine, t-phenyl arsine, triethyl arsine, trisilyl arsine and tripropyl arsine. Since the heavier molecules will diffuse more slowly than the lighter $AsH_3$ molecule, the net effect is to reduce the arsenic concentration at the bottom of the trench, thus increasing the deposition rate of the amorphous silicon at that location.

In yet another alternative, the arsenic source can be pulsed into the process chamber. In this manner the amount of arsenic available to diffuse into the trench is reduced and the flow of gas across the top of the wafer tends to quickly deplete the arsenic source gas above the wafer during those periods where the flow of $AsH_3$ gas is interrupted. By rapidly pulsing gases in a manner akin to an ALD process, a high arsenic concentration is achieved at the surface of the wafer, while diffusion of arsine into the trench is further reduced.

In still another embodiment, diffusion of the arsenic source into the trench can be further slowed by using a higher molecular weight diluent gas instead of the lighter and more common $N_2$ diluent. For example, various solvents (when properly vaporized) such as high order alkanes and cyclic alkanes can be used as a diluent gas to slow the diffusion of arsine into the trench. Exemplary vaporizable solvents include butane, pentane, hexane, octane and hexadecane.

While the invention herein has been described in connection with the use of arsenic as the dopant, it should be appreciated that other dopants may be used. Also, the temperatures, pressures and times of reaction described here are for illustrative purposes only. It will be appreciated, that other times, pressures, and reactant concentrations, consistent with the teachings herein, can be used without departing from the spirit and scope of the invention.

While the foregoing is directed to embodiments of the present invention, other and further embodiments of the invention may be devised without departing from the basic scope thereof, and the scope thereof is determined by the claims that follow.

The invention claimed is:

1. A method of treating a substrate having a high aspect-ratio structure, comprising:
   positioning the substrate in a process chamber;
   providing a gas mixture to the process chamber, the gas mixture comprising silane at a first flow rate and an arsenic compound at a second flow rate, wherein the second flow rate divided by the first flow rate forms a ratio;
   selecting the ratio to form an arsenic doped film on the substrate, the arsenic doped film having a pre-selected step coverage between about 100% and about 150%; and
   reacting the silane and the arsenic compound in a thermal deposition process to deposit the arsenic doped film.

2. The method of treating a substrate having a high aspect-ratio structure according to claim 1, wherein the ratio is between about $2 \times 10^{-4}$ and about $5 \times 10^{-4}$.

3. The method of treating a substrate having a high aspect-ratio structure according to claim 1, further comprising maintaining the pressure in the process chamber between about 0.5 Torr and about 10 Torr during the thermal deposition process.

4. The method of treating a substrate having a high aspect-ratio structure according to claim 1, wherein the arsenic doped film is deposited at a rate between about 20 Å/min and about 60 Å/min.

5. The method of treating a substrate having a high aspect-ratio structure according to claim 1, wherein the arsenic compound is selected from the group consisting of arsine, tert-butyl arsine, trimethyl arsine, tert-phenyl arsine, triethyl arsine, trisilyl arsine, tripropyl arsine, and combinations thereof.

6. The method of treating a substrate having a high aspect-ratio structure according to claim 1, wherein the arsenic compound is arsine.

7. The method of treating a substrate having a high aspect-ratio structure according to claim 1, wherein the gas mixture further comprises a diluent.

8. The method of treating a substrate having a high aspect-ratio structure according to claim 7, wherein the diluent is selected from the group consisting of nitrogen gas, butane, pentane, hexane, octane, hexadecane, and combinations thereof.

9. The method of treating a substrate having a high aspect-ratio structure according to claim 7, wherein the diluent is nitrogen gas.

10. The method of treating a substrate having a high aspect-ratio structure according to claim 6, wherein the gas mixture further comprises nitrogen gas.

11. The method of treating a substrate having a high aspect-ratio structure according to claim 1, further comprising forming a barrier layer on the substrate before providing the gas mixture to the processing chamber.

12. The method of treating a substrate having a high aspect-ratio structure according to claim 11, wherein the barrier layer is an amorphous silicon layer.

13. The method of treating a substrate having a high aspect-ratio structure according to claim 1, wherein the arsenic compound is provided to the process chamber in pulses.

14. A method of treating a substrate having a high aspect-ratio structure, comprising:
    positioning the substrate in a process chamber;
    selecting a step coverage between 100% and 150%;
    providing a gas mixture to the process chamber, the gas mixture comprising silane at a first flow rate and an arsenic compound at a second flow rate;
    selecting a ratio of the second flow rate to the first flow rate to form a layer having the selected step coverage; and
    reacting the silane and the arsenic compound in a thermal deposition process to deposit an arsenic doped film.

15. The method of treating a substrate having a high aspect-ratio structure according to claim 14, further comprising maintaining the pressure in the process chamber between about 2 and about 8 Torr.

16. The method of treating a substrate having a high aspect-ratio structure according to claim 14, wherein the arsenic compound is selected from the group consisting of arsine, tert-butyl arsine, trimethyl arsine, tert-phenyl arsine, triethyl arsine, trisilyl arsine, tripropyl arsine, and combinations thereof.

* * * * *